United States Patent [19]

Yang et al.

[11] Patent Number: 4,896,057
[45] Date of Patent: Jan. 23, 1990

[54] HIGH-SPEED DYNAMIC DOMINO CIRCUIT IMPLEMENTED WITH GAAS MESFETS

[75] Inventors: Long Yang, Edison, N.J.; Stephen I. Long, Santa Barbara, Calif.

[73] Assignee: United States of America as represented by the Administrator, National Aeronautics and Space Administration, Washington, D.C.

[21] Appl. No.: 244,761

[22] Filed: Sep. 14, 1988

[51] Int. Cl.$^4$ .......................................... H03K 19/096
[52] U.S. Cl. .................................... 307/448; 307/450; 307/453; 307/481
[58] Field of Search ............... 307/443, 448, 450, 453, 307/475, 481, 264, 269, 246

[56] References Cited

U.S. PATENT DOCUMENTS

| | | | |
|---|---|---|---|
| 4,410,815 | 9/1983 | Ransom et al. | 307/475 |
| 4,438,351 | 3/1984 | Scheurmeyer | 307/450 |
| 4,494,016 | 1/1985 | Ransom et al. | 307/450 |
| 4,514,649 | 4/1985 | Nuzillat et al. | 307/450 |
| 4,631,426 | 12/1986 | Nelson et al. | 307/473 |
| 4,663,543 | 5/1987 | Sitch | 307/450 |

OTHER PUBLICATIONS

Deming, et al., "A Gallium Arsenide Configurable Cell Array Using Buffered FET Logic", IEEE Journal of Solid-State Circuits, Vol. SC-19, No. 5, pp. 728-738, October, 1984.

Krambeck, et al., "High-Speed Compact Circuits with CMOS", IEEE Journal of Solid-State Circuits, Vol. SC-17, No. 3, pp, 614-619, Jun., 1982.

D'avanzo, D. C., "Proton Isolation for GaAs Integrated Circuits", IEEE Trans. on Electron Devices, Vol. ED-29, No. 7, pp. 1051-1059, Jul., 1982.

Primary Examiner—David Hudspeth
Attorney, Agent, or Firm—Thomas H. Jones; John R. Manning; Charles E. B. Glenn

[57] ABSTRACT

A dynamic logic circuit (AND or OR) utilizes one depletion-mode metal-semiconductor FET for precharging an internal node A, and a plurality of the same type of FETs in series, or a FET in parallel with one or more of the series connected FETs for implementing the logic function. A pair of FETs are connected to provide an output inverter with two series diodes for level shift. A coupling capacitor may be employed with a further FET to provide level shifting required between the inverter and the logic circuit output terminal. These circuits may be cascaded to form a domino chain.

7 Claims, 3 Drawing Sheets

INPUT STAGE | INVERTER STAGE | LEVEL-SHIFT STAGE

HIGH-SPEED DYNAMIC DOMINO CIRCUIT IMPLEMENTED WITH GAAS MESFETS

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates to synchronous dynamic circuits, and more particularly to dynamic GaAs depletion mode MESFET (metal-semconductor field-effect transistor) logic gates in which information propagates through a chain of gates, rippling from stage to stage as in a chain of dominos.

BACKGROUND ART

Dynamic logic circuits have been used as an effective power conservation tool in silicon MOS technology.

GaAs FETs have been used to implement static logic and memory circuits in various applications (static RAMs, adders, multipliers, etc.). However, implementation of dynamic circuits with GaAs FETs has not been as well developed as its static counterpart due to leakage of the forward biased Schottky barrier gate diode of the FETs, and the often critical timing requirements on the clock. Circuits intended for very high speed, and not very low power, have been emphasized, such as a dynamic frequency dividers and shift registers. These circuits used only the concept of the pass transistor in combination with GaAs MESFET buffered FET logic (BFL). Consequently, power dissipation was very high. The charge storage, which is the main feature of the dynamic circuit, is not fully utilized in this approach.

Charge control devices (CCDs) have been implemented by GaAs FETs and show very fast operation. However, the circuit applications available to the CCD are limited, and the need for three- or four-phase clocks increases the complexity and power dissipation. The present invention addresses the need for low power, high speed logic circuits with an acceptable noise margin. While GaAs enhancement or depletion mode MESFETs satisfy the first two criteria in static logic circuits, it cannot produce high-yield LSI/VLSI circuits due to its low noise margins (<200 mV).

Domino circuits were first developed for silicon CMOS as a means of increasing speed and circuit density. A domino circuit, as the term is used herein, refers to a single stage, the function of which is to propagate to the next stage in a chain of stages the logic information developed from information introduced into the circuit, such as in a 2-input or 4-input AND gate. Dynamic logic circuits have been used as an effective power conservation tool in silicon MOS technology. See R. H. Krambeck, C. M. Lee and H. S. Low, "High-speed compact circuits with CMOS," IEEE J. Solid State Cir., SC-17, No. 3, pp 614-619, June 1982.

STATEMENT OF THE INVENTION

An object of this invention is to implement a dynamic logic circuit using MESFETs due to the available fabrication technology and to allow no more than two clock phases or levels to simplify layout and retain high density.

In accordance with the present invention, a dynamic logic gate (AND or OR) is comprised of a plurality of MESFETs, hereinafter sometimes referred to simply as FETs. For an AND gate, a plurality of input FETs are connected in series between Vdd and circuit ground. One FET of this input stage receives a clock signal and the remaining FETs receive binary data input signals. A node A between the clock FET and the data FETs is coupled to an output terminal by an inverter stage having two level-shift diodes between the inverting FET and ground for biasing that FET. Level shifting between AND gates in cascade is done by a coupling capacity, although a static source follower could be substituted for the coupling capacitor, in which case an output FET is not required for discharging the coupling capacitor. That output FET is turned on in synchronism with the synchronizing clock of the gate, but of different voltage levels. To use this dynamic domino logic circuit as an OR gate, an FET is connected in parallel with one or more of the AND-gate FETs.

The novel features that are considered characteristic of this invention are set forth with particularity in the appended claims. The invention will best be understood from the following description when read in connection with the accompanying drawings.

DETAILED DESCRIPTION OF THE INVENTION

Figure 1:
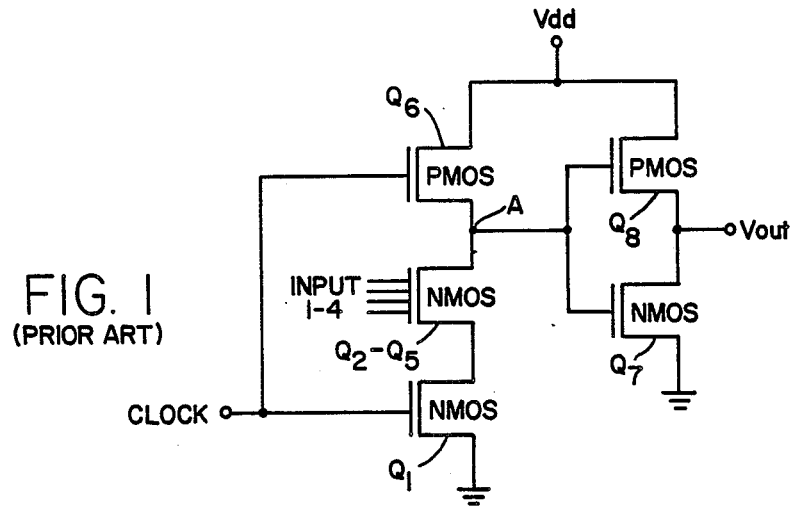
FIG. 1 illustrates a prior-art CMOS domino four-input AND gate.

Dynamic silicon CMOS circuits have found widespread application due to the many performance advantages provided by the domino approach. A typical CMOS domino four-input AND gate is shown in FIG. 1 comprises of transistors $Q_1$ through $Q_8$. For convenience, four series connected NMOS transistors $Q_2$ through $Q_5$ are shown schematically as one with four inputs to the gate instead of as four NMOS transistors, each with a separate gate. All four inputs must be on at the time the clock goes high in order for the internal node A to be connected to circuit ground by the transistor $Q_1$ during the transfer phase. Otherwise the node A is continually connected to Vdd by transistor $Q_6$. By incorporating a static inverter (transistors $Q_7$ and $Q_8$) in each domino stage (only one of which is shown in FIG. 10, the output will remain low during the precharge clock phase. Thus, the combinational input structure is never exposed to dc current flow even though only one clock phase is used. The speed of the gate is enhanced because the full pull-up current of the precharge phase is available for charging the gate node capacitance. Also, the full pull-down current of the combinational logic transistors $Q_1$–$Q_5$ is available during the evaluation phase for discharging this node. Because the logic is no longer ratioed, very complex combinational functions can be accomplished in a single logic gate structure.

Many of the advantages of the domino approach also are possible when implemented with GaAs MESFET or heterostructure FET (HFET) devices. Other dynamic circuit approaches were evaluated, but most were found inconvenient in their implementation or lacking in performance. For example, circuits employing both transmission gates and precharging transistors require two different voltage swings, a requirement which was deemed impractical in comparison to the domino approach.

The typical domino AND gate in CMOS technology shown in FIG. 1 requires both n- and p-channel enhancement-mode (E-mode) transistors. In the present invention, shown in FIG. 2, the circuit is composed of single threshold voltage ($-1$ v) D-mode n-channel GaAs MESFETs (referred to hereinafter as FETs 1 through 7 which are available with standard MESFET fabrication techniques. Therefore, some level shifting is required for I/O compatibility, which is accomplished by a FET 8. The input stage comprises of FETs 1–5 is used to compute the input combinational logic. The inverter stage comprises of FETs 6 and 7 is used to store the charge on the gate capacitor and predischarge the input of the next domino circuit.

The basic domino circuit operations are: (1) when the clock $\phi_{11}$ is high, it precharges the internal node A, and predischarges the output to Vss, and (2) when the clock is low, FET 5 is cut off, and the charge of the internal node A may be discharged through the FET chain in the input stage depending on the outputs of the previous domino circuits. Then the information propagates to the next domino circuit in cascade, rippling stage to stage in response to clock pulses as in a chain of dominos.

Two level-shift diodes $D_1$ and $D_2$ are used between the source of the FET 6 and ground for biasing because the threshold voltage is negative. The level shifting required between the inverter FET 6 and the output of the domino circuit is done by a coupling capacitor $C_1$ to reduce the delay and power consumption of the circuit. The value of capacitance needed depends on the output voltage swing desired, the load capacitance due to to interconnect lines, and the number of fan-outs. The charge stored in the capacitor $C_1$ will be shared by the output (load) capacitance when switching. The coupling capacitor $C_1$ for single fan-out is approximately the same as the gate capacitance of the next stage, about 50 pF. If large load capacitances must be driven, either the coupling capacitance must be increased in size to remain comparable to the load, or a static buffer provided. In cases with very long lines or high fan-out, the second option is more attractive. A static source follower was substituted for the coupling capacitor on our test circuits and was found suitable as a final level-shift stage for driving the domino outputs off-chip. Thus, this approach could also be used on-chip for driving large capacitive loads.

Figure 2:
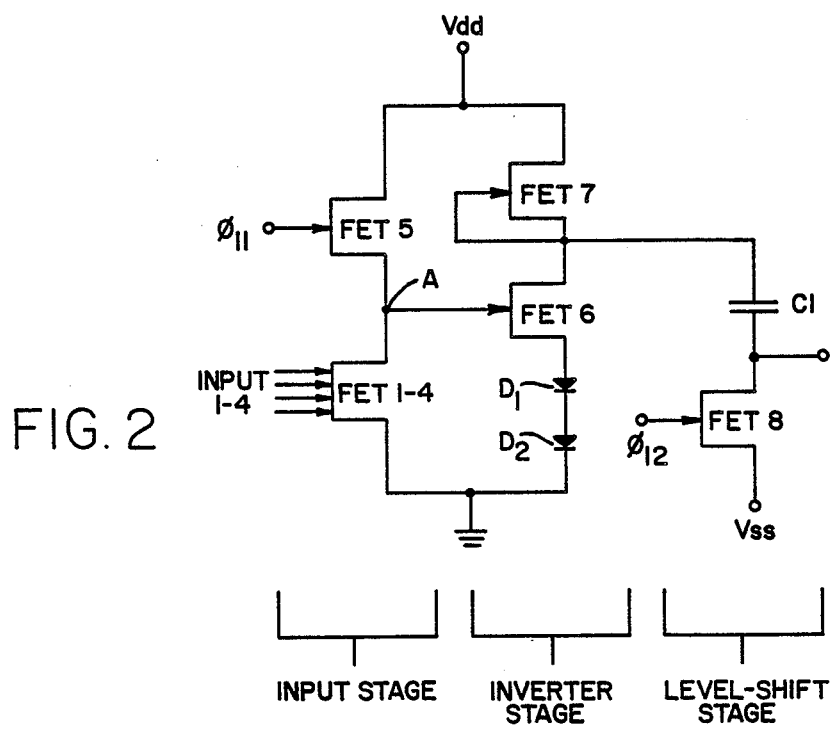
FIG. 2 illustrates a GaAs domino circuit comprised of D-mode MESFET in accordance with the present invention with four inputs.

Node A in FIG. 2 is the node which must be precharged to logic high so that the output voltage of the inverter stage is low. Here design of the circuit takes advantage of the negative threshold voltage of the FET to reduce gate leakage because it is possible to bias $V_{gs}$ of FET 6 to around zero volt, and there is still enough current through FET 6 to quickly pull the output of the inverter low. By avoiding substantial forward bias on the gate, the leakage current through the gate of FET 6 is minimized.

Other leakage currents in the circuit are the subthreshold current of FETs 1–4 and the substrate leakage current. The larger the leakage current, the faster the information will be lost, and the faster the refresh cycle needs to be performed which limits the operation of the circuit. The only leakage likely is through the subthreshold current of FETs 1–4 if the isolation between the devices is good. The isolation may be improved by proton, boron or oxygen bombardment, and the substrate leakage current is quite low for the potential differences used in the circuit (10 nA). Subthreshold current can be suppressed by reducing the logic low voltage level which is easily accomplished by making Vss more negative. A higher operating temperature would increase this leakage current and, consequently, low-frequency operation might be restricted. However, the low power dissipation of these circuits reduces the possibility of heating problems in commercial use. Also, this circuit is most attractive for high-speed applications with clock frequencies over 100 MHz.

Even though the level shifting required for the depletion mode is a nuisance, the low gate leakage current, high noise margin, and high speeds would not be possible if the circuit were implemented with E-mode devices. With FET threshold voltage $V_T$ as low as $-1$ V, level-shifted single-phase clock $\phi_{11}$ and $\phi_{12}$ are also required, i.e., separate synchronous and in phase clocks $\phi_{11}$ and $\phi_{12}$ are required at different voltage levels, both of which are referred to collectively as "the clock." However, this is an artifact of available technology, and with a dual threshold-voltage process, only one clock level would be needed.

Operation of the 4-input AND gate shown in FIG. 2 will now be described in greater detail. FETs 5 and 8 precharge the internal node A and predischarge the output node when the clock is high. When that clock is low, FETs 5 and 8 are cut off. The charge of the internal node A thus produced may be discharged through the FETs 1–4 depending on the inputs from a previous domino circuit, i.e., if all four inputs are high. Thus, the information propagates through the domino circuit of FIG. 2, rippling circuit to circuit as in a chain of dominos.

The inverter stage requires the two level-shift diodes $D_1$ and $D_2$ in series with the FET 6, as noted hereinbefore, due to the negative threshold voltage of the FET 6. In order to avoid discharging node A through the Schottky barrier of the gate of FET 6, the precharge voltage of node A should not forward bias that Schottky barrier to cause a substantial gate current. Therefore, by taking advantage of the negative threshold voltage, the width ratio of the inverter stage is designed so that the output of the inverter is high while the gate-to-source voltage $V_{gs}$ of FET 6 is around zero volts. The necessary level shifting is then done by the coupling capacitor. However, a static level shift stage may be used to drive an output pad or a large on-chip capacitive load. The coupling capacitor $C_1$ is provided as either a pure crossover capacitor between first and second layer metals or a combination of a crossover capacitor and reverse biased Schottky diode capacitor to save chip area.

Figure 3A:
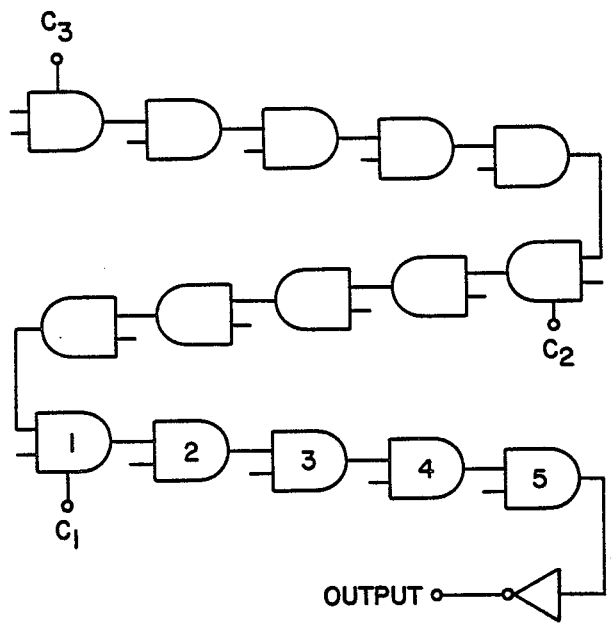
FIG. 3a illustrates a logic diagram of a chain or AND gates comprised of D-mode MESFETs cascaded to measure ripple delay time as shown in FIG. 2, but with two inputs.
Figure 3B:
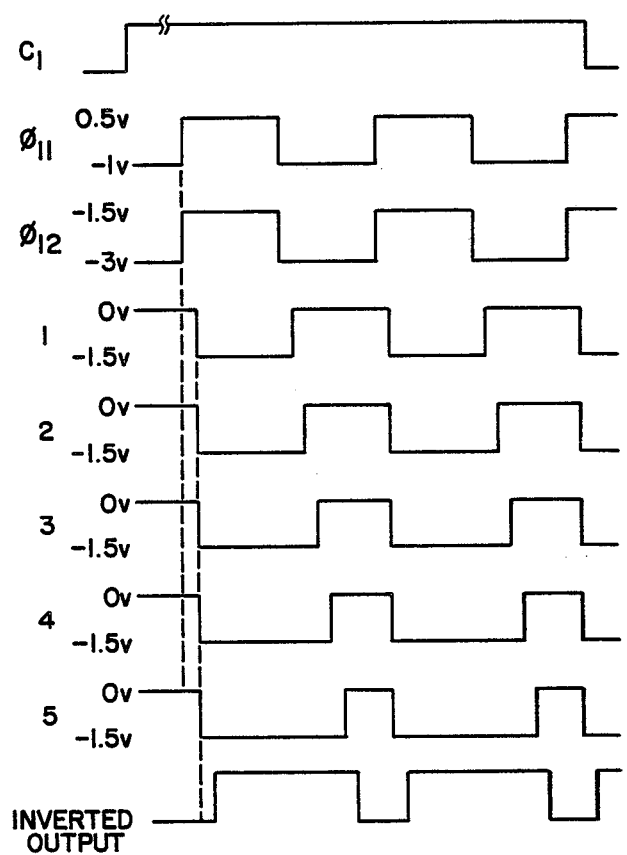
FIG. 3b is a timing diagram for the circuit to FIG. 3a operating from a gate enabled by a signal $C_1$ to the final output gate.
Figure 3C:
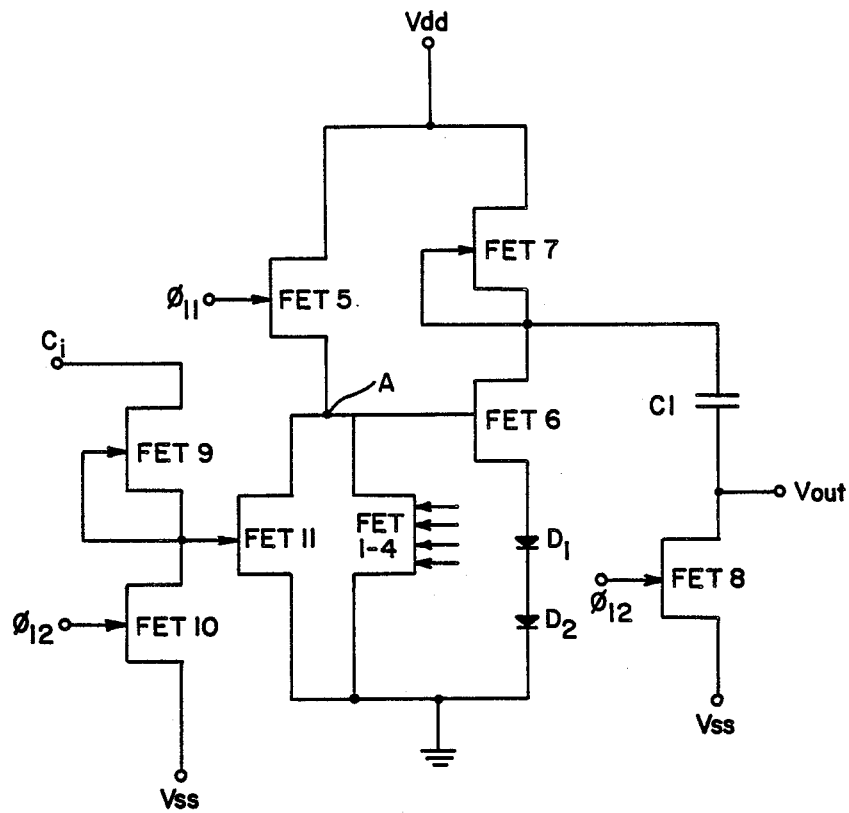
FIG. 3c illustrates a circuit comprised of FETs 9, 10 and 11 used to enable a gate in the diagram of FIG. 3a with a control signal $C_i$. This circuit also illustrates how the circuit of FIG. 2 may be used as an OR gate by having FETs 1 and 14 connected in parallel, each with its separate binary data input.

In order to test the speed of the GaAs domino circuit, a chain of 15 two-input domino circuit AND gates shown in FIG. 3a was designed and laid out with 1.5 $\mu$m minimuim line width. Some dc voltage control signals $C_1$, $C_2$ and $C_3$ were used to electronically change the number of propagating stages so that the delay per domino circuit could be inferred from differences in delay through the gate chain instead of a much more difficult and inaccurate direct measurement which would include delays in the inverting off-chip driver and cables. FIG. 3b is a timing diagram of propagation to the output of an inverter following the last AND gate while a control signal $C_1$ is present, and FIG. 3c is a schematic diagram of the first AND gate (No. 1 in the diagram) to which the control signal $C_1$ is applied, i.e., of a domino circuit with the selectable control input $C_i$ through a circuit comprised of FETs 9, 10 and 11. Here it can be seen that the gate of FET 11 is predischarged through FET 10 by the clock. If $C_1$ is high (enabled), then the gate of FET 11 will be at the logic high voltage during the evaluation time. Thus, an output from this domino circuit will be produced regardless of the state of inputs to the FETs 1-4 shown in FIG. 3c. This domino circuit can be used to generate a synchronized output which will ripple through all subsequent domino circuits unless it is blocked by another similar stage in its enabled state.

The minimum propagation delay was found to be 168 ps/domino circuit for two-input AND gates and 200 ps/domino circuit for four-input AND gates after optimization of the voltage supplies and clocks. This indicates that 180 ps/domino circuit for a two-input AND gate and 220 ps for a four-input AND gate is easily achieved. Because of the nature of the domino circuit, the width ratio of the pull-up and pull-down FETs is not required for optimization of the noise margin. Therefore, an increased number of series connected FETs in the input of each AND gate will only increase the delay of the AND gate because of increased capacitance or resistance, and will not cause any circuit malfunction until the delay exceeds the storage time of the domino circuit.

It has been demonstrated the domino circuit may function as an n-input AND gate implemented by GaAs D-mode MESFETs. Measured propagation delays of 180 ps/domino circuit for a two-input AND gate and 220 ps/domino circuit for a four-input AND gate have been achieved. The storage time of the internal node A was found to be as long as 2-3 $\mu$s, which gives a low-frequency limit of 100 kHz. It has also been shown in FIG. 3c how the FET 11 may be used to synchronize an asynchronous control signal $C_i$. This FET 11 may also be used to implement an OR function. For instance, if the gate of FET 11 receives an input signal V, while the four-input FETs 1-4 receive signals W, X, Y and Z, the domino circuit forms the logic function $V+W\cdot X\cdot Y\cdot Z$.

Since the chain circuit tested was fabricated in a multiproject chip evironment, the devices were not optimized for the intended dynamic domino approach. The performance of the domino circuit could be further improved if the gate length is reduced to 1 $\mu$m. The simulation results from the 1 $\mu$m GaAs MESFET predict the propagation delays, 100 and 150 ps for two-and four-input AND gates, respectively. Therefore the dynamic domino circuit presents the characteristics of high speed and low power consumption with potentially high noise margin and high yield, which is an attractive combination for high-speed circuit applications.

A combination of a plurality of domino AND and OR circuits can be used to implement complex logic functions, such as the carry generation of a 4-bit carry-save binary adder, where $c_{i-1}$ is the carry in from a previous 4-bit binary adder stage and $a_i$ and $b_i$ are the adder inputs. The delay from the carry in to the carry out of the 4-bit carry save adder was found to be 400 ps from a simulated test.

Although particular embodiments of the invention have been described and illustrated herein, it is recognized that modifications and variations may readily occur to those skilled in the art. For example, the semiconductor material for the dynamic logic gates may be other than GaAs, such as silicon. Consequently, it is intended that the claims be interpreted to cover such modifications and variations.

We claim:

1. A dynamic logic gate comprised of a plurality of metal-semiconductor field-effect transistors each having a source terminal, a drain terminal, and a gate terminal for control of current flow from said source to said drain terminal, said logic gate having a first transistor connected in series for current conduction with one or more data input transistors between a source of bias potential and circuit ground, said first transistor having its gate connected to a clock pulse source for precharging an internal node between said first transistor and said one or more data input transistors by turning said first transistor on during the presence of a clock pulse, following which data inputs applied to gates of said one or more data input transistors may discharge said internal node depending on the logic level of said data inputs, and two output metal-semiconductor field-effect transistors connected as an inverter having the input gate of said inverter connected to said internal node.

2. A dynamic logic gate as defined in claim 1 wherein said one or more data input transistors are connected in series between said internal node and circuit ground to provide an AND binary logic function of said data inputs.

3. A dynamic logic gate as defined in claim 2 including an additional metal-semiconductor field-effect transistor connected in parallel with at least one of said one or more data input transistors to provide an OR binary logic function with a data input applied to the gate of said additional transistor and inputs to said one or more data input transistors.

4. A dynamic logic gate as defined in claim 1 wherein only one data input transistor is provided and an additional metal-semiconductor field-effect transistor connected in parallel with said one or more data input transistors is provided with a separate input signal to the gate of said additional transistor to form a gate providing a logic OR binary logic function with inputs to said one or more data input transistors.

5. A dynamic logic gate as defined in claim 4 wherein said separate input signal to the gate of said additional transistor is provided through two input metal-semiconductor field-effect transistors connected as an inverter between a source of said separate input terminal and the gate terminal of said additional transistor connected in parallel with said one transistor.

6. A dynamic logic gate as defined in claim 5 wherein said input inverter is connected between a source of a control signal and a source of reference potential independent of said source of reference potential for said one or more data input transistors, and where said separate input signal is a clock pulse in phase with said clock pulse connected to said first transistor to thereby synchronize said control signal applied to the gate terminal of said additional transistor.

7. A dynamic logic gate as defined in claim 1 receiving data inputs from similar logic gates and transmitting output logic function signals to similar logic gates in a chain, thereby to form a dynamic domino circuit.

* * * * *